(12) United States Patent
Nguyen et al.

(10) Patent No.: US 6,897,699 B1
(45) Date of Patent: May 24, 2005

(54) CLOCK DISTRIBUTION NETWORK WITH PROCESS, SUPPLY-VOLTAGE, AND TEMPERATURE COMPENSATION

(75) Inventors: Huy Nguyen, San Jose, CA (US); Roxanne Vu, San Jose, CA (US); Benedict Lau, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 40 days.

(21) Appl. No.: 10/199,232

(22) Filed: Jul. 19, 2002

(51) Int. Cl.[7] .............................................. G06F 1/04
(52) U.S. Cl. ...................................... 327/295; 327/565
(58) Field of Search ................................. 327/295, 291, 327/292, 293, 565

(56) References Cited

U.S. PATENT DOCUMENTS

| | | | | | |
|---|---|---|---|---|---|
| 5,128,554 | A | * | 7/1992 | Hoshizaki | 327/147 |
| 5,128,940 | A | * | 7/1992 | Wakimoto | 370/544 |
| 5,614,855 | A | | 3/1997 | Lee et al. | 327/158 |
| 5,742,798 | A | * | 4/1998 | Goldrian | 713/400 |
| 5,850,157 | A | | 12/1998 | Zhu et al. | 327/295 |
| 6,125,157 | A | | 9/2000 | Donnelly et al. | 375/371 |
| 6,229,638 | B1 | | 5/2001 | Sakai et al. | 359/212 |
| 6,311,313 | B1 | | 10/2001 | Camporese et al. | 716/6 |
| 6,380,788 | B1 | * | 4/2002 | Fan et al. | 327/295 |
| 6,433,598 | B1 | * | 8/2002 | Schultz | 327/161 |
| 6,501,311 | B2 | * | 12/2002 | Lutkemeyer | 327/161 |
| 6,593,792 | B2 | * | 7/2003 | Fujii | 327/276 |

FOREIGN PATENT DOCUMENTS

JP        2000035831 A   *  2/2000   ............. G06F/1/10

OTHER PUBLICATIONS

"Digital Systems Engineering," William J. Dally and John W. Poulton. Published by the Press Syndicate of the University of Cambridge, The Pitt Building, Trumpington Street, Cambridge CB2 IRP. United Kingdom, 1998. pp. 449–457 and front cover and publishing page.

"A Variable–Frequency Parallel I/O Interface with Adaptive Power–Supply Regulation," Gu–Yeon Wei, Jaeha Kim, Dean Liu, Stefanos Sidiropoulos, and Mark A. Horowitz. IEEE Journal of Solid–State Circuits, vol. 35, No. 11, Nov. 2000. pp. 1600–1609.

"Techniques to Reduce Power in Fast Wide Memories," Bharadwaj S. Amrutur and Mark Horowitz. Center for Integrated Systems, Stanford University, CA 94305, and IEEE Symp. Low Power Electronics Dig. Tech. Papers, Oct. 1994. 2 pages.

"Rambus® Signaling Technologies RSL, QRSL and SerDes Technology Overview." Rambus Inc. ©Copyright June, 2000. 3 pages.

"AN–5017 LVDS Fundamentals." Fairchild Semiconductor Application Note Dec. 2000, revised Dec. 2000. 5 pages.

"LVDS Splitter Simplifies High–Speed Signal Distribution." Copyright © 2002 Maxim Integrated Products, Sunnyvale, CA 94086. 4 pages.

(Continued)

Primary Examiner—Timothy P. Callahan
Assistant Examiner—Cassandra Cox
(74) Attorney, Agent, or Firm—Silicon Edge Law Group LLP; Arthur J. Behiel

(57) ABSTRACT

Described are methods and systems for distributing low-skew, predictably timed clock signals. A clock distribution network includes a plurality of dynamically adjustable clock buffers. A control circuit connected to each clock buffer controls the delays through the clock buffers in response to process, voltage, and temperature variations, and consequently maintains a relatively constant signal-propagation delay through the network. In one embodiment, each clock buffer includes skew-offset circuitry that adds to or subtracts from the PVT compensated delay values provided by the PVT control circuit to simplify clock skew minimization.

47 Claims, 8 Drawing Sheets

OTHER PUBLICATIONS

"High Speed BUS LVDS Clock Distribution Using the DS92CK16 Clock Distribution Device (AN–1173)," Milt Schwartz. National Semiconductor, Application Note 1173, Sep. 2000. 8 pages.

"Low–Power Area–Efficient High–Speed I/O Circuit Techniques," Ming–Ju Edward Lee, William J. Dally, and Patrick Chiang. IEEE Journal of Solid–State Circuits, vol. 35, No. 11, Nov. 2000. pp. 1591–1599.

"A 0.4–4Gb/s CMOS Quad Transceiver Cell Using On–Chip Regulated Dual–Loop PLLs," Kun–Yung Ken Chang, Jason Wei, Simon Li, Kevin Donnelly, Charles Huang, and Stefanos Sidiropoulos. Rambus, Inc., Los Altos, CA; T–RAM Inc., San Jose, CA; Aeluros Inc, Mountain View, CA. Jun. 2002, 4 pages.

* cited by examiner

CLOCK DISTRIBUTION NETWORK WITH PROCESS, SUPPLY-VOLTAGE, AND TEMPERATURE COMPENSATION

FIELD OF THE INVENTION

The present invention relates to systems and methods for distributing clock signals in integrated circuits.

BACKGROUND

Typical integrated circuits (ICs, or "chips") include large numbers of synchronous storage elements sharing a common clock signal. Ideally, each signal edge of the common clock signal arrives at each destination simultaneously. In practice, however, this ideal is difficult to achieve. The extent to which a propagating clock signal arrives at different destinations at different times is commonly referred to as "clock skew." In general, clock skew is the maximum delay between clock-edge arrival times between two or more clock destination nodes.

Clock distribution networks are routinely modeled and simulated to minimize clock skew, or "nominal clock skew." The main contributors to nominal clock skew are resistive, capacitive, and inductive loading of clock lines. Loading effects are well understood, and so can be modeled to produce effective behavioral predictions. Unfortunately, such predictions do not fully account for less predictable skew variations, such as those imposed by process, supply-voltage, and temperature variations.

Clock skew is typically minimized by balancing the signal propagation delays of the various clock paths, which involves equalizing the loads associated with those paths. In a typical example, inverters and capacitors are included along relatively fast clock paths to increase the load—and reduce the speed—of those paths. Unfortunately, adding loads to clock lines wastes power and tends to increase clock jitter.

Even if a clock network is perfectly balanced (i.e., if the clock skew is zero), the signal propagation delay through the network can vary significantly with process, voltage, and temperature (PVT) variations. Such variations can be problematic whether they increase or reduce signal propagation delay: a slow clock network reduces speed performance; a fast clock increases noise and power consumption. There is therefore a need for improved methods and systems for distributing low-skew, predictably timed clock signals.

SUMMARY

The present invention addresses the need for improved methods and systems for distributing low-skew, predictably timed clock signals. A clock distribution network in accordance with one embodiment includes a plurality of dynamically adjustable clock buffers. A control circuit connected to each clock buffer controls the delays through the clock buffers in response to PVT variations, and consequently maintains a constant signal-propagation delay through the network.

In accordance with another embodiment, each clock buffer includes skew-offset circuitry that adds to or subtracts from the PVT-compensated delay value provided by the PVT control circuit. This embodiment simplifies the task of minimizing clock skew in the PVT-compensated network. In one such embodiment, loading a skew register with appropriate offset values adjusts the skew offsets for the various clock buffers.

Conventional clock distribution networks generally include clock buffers capable of providing a maximum slew rate dictated by the fastest expected clock speed. Unfortunately, such fast-switching buffers are not optimized for lower clock speeds, and consequently consume more power than is necessary for low-speed operation. In contrast, the strength of the above-described clock buffers—and thus the power they dissipate—depends upon the speed of the clock. Clock distribution networks in accordance with some embodiments of the invention thus automatically compensate for reduced clock speeds with reduced power consumption.

Some embodiments distribute small-swing clock signals to reduce noise and improve speed performance. "Small-swing" signals transition between extreme voltage levels that are substantially less than the voltage difference separating the supply voltages (e.g., Vdd and ground). Small-swing clock distribution networks may employ single-ended or differential signaling.

This summary does not limit the invention.

DETAILED DESCRIPTION

Figure 1:
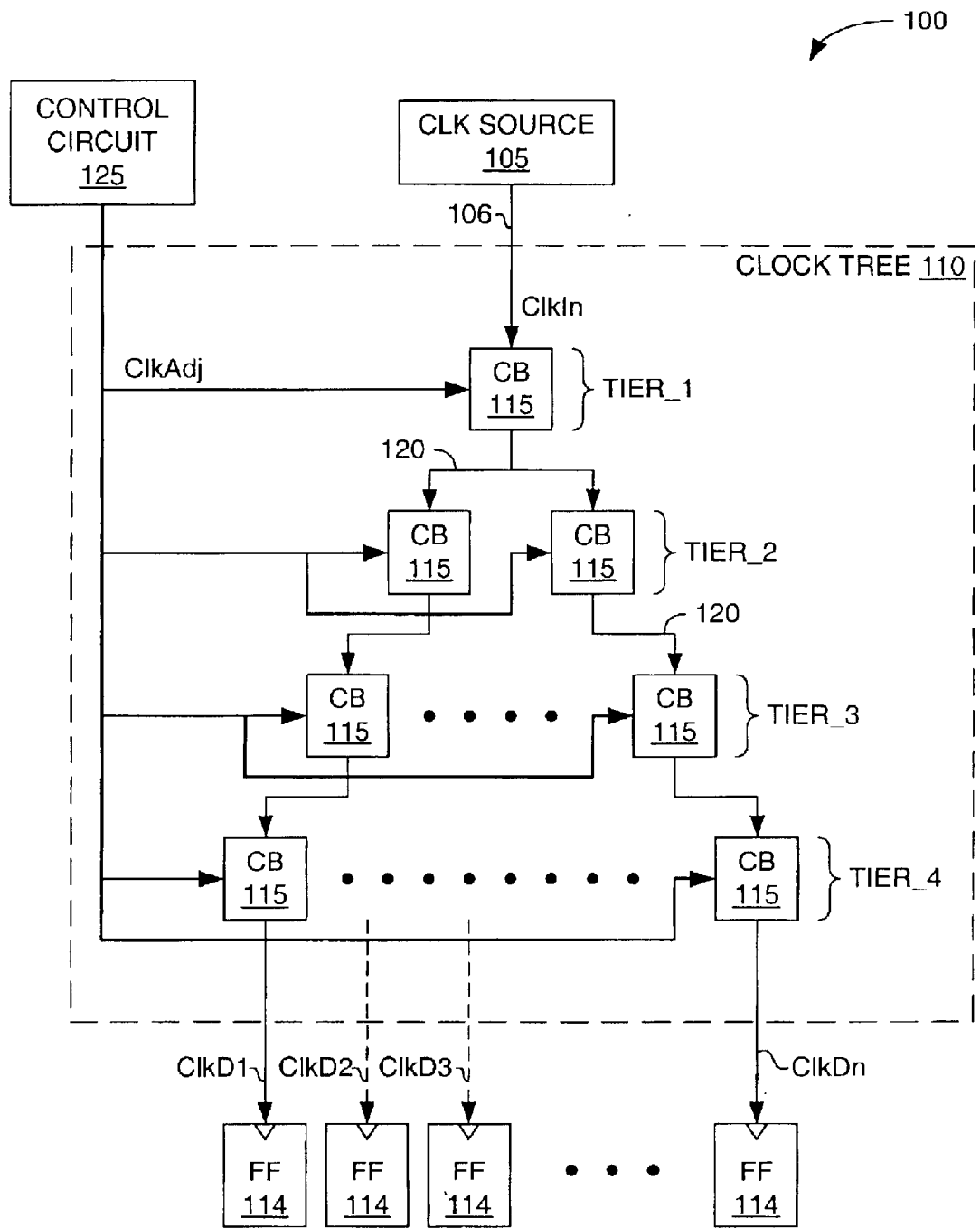
FIG. 1 depicts a clock distribution network 100 in accordance with one embodiment of the invention.

FIG. 1 depicts a clock distribution network 100 in accordance with one embodiment of the invention. Network 100 includes a clock source 105 connected to the root node 106 of a clock tree 110. Clock tree 110 distributes an input clock ClkIn to a number of clock destination nodes ClkD1–ClkDn. Some conventional flip-flops 114 illustrate possible clock destinations.

Clock tree 110 includes four clock tiers, each of which includes at least one dynamically adjustable clock buffer 115. The tiers are interconnected by a number of conventional clock branches 120. In accordance with the invention, each clock buffer 115 connects to a control circuit 125 adapted to dynamically control the signal-propagation delays through each tier, and consequently through the entire clock tree. Control circuit 125 controls each clock buffer 115 via a clock-adjust signal ClkAdj that varies with process, supply-voltage, and temperature (PVT) variations.

Figure 2:
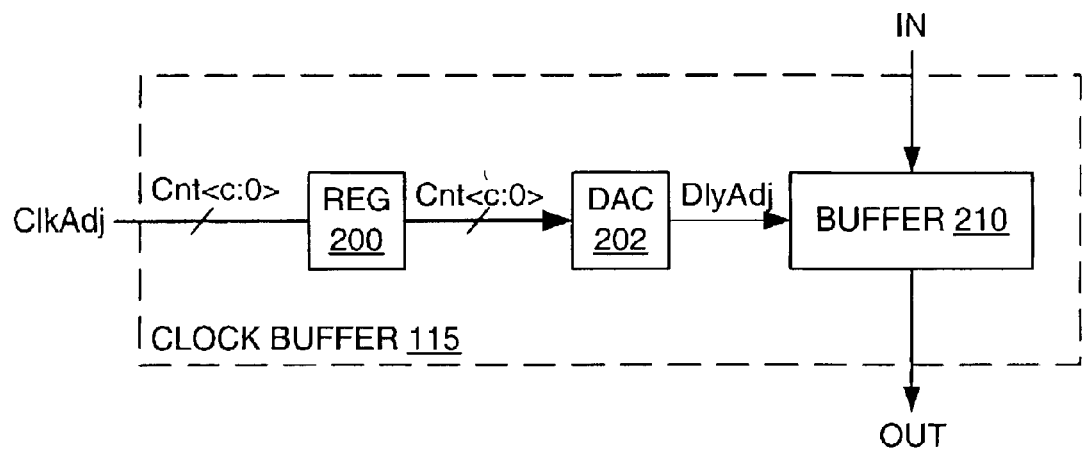
FIG. 2 depicts one embodiment of clock buffers 115 of FIG. 1.

FIG. 2 depicts one embodiment of a clock buffer 115 (FIG. 1). In this embodiment, the clock-adjust signal ClkAdj is a multi-bit digital signal conveyed in parallel along a bus Cnt<c:0> to an input port of a register 200. Register 200, periodically updated to account for power-supply and temperature fluctuations, presents its output to a digital-to-analog converter (DAC) 202. DAC 202 responds by developing one or more delay-adjust signals DlyAdj proportional to the count from register 200. Delay adjust signal DlyAdj controls the signal-propagation delay through a CMOS buffer 210. (As with many signals discussed herein, delay adjust signal DlyAdj is conveyed on a like-named line or bus.) Buffer 210 is included in clock tree 110 so the input terminal IN connects either to clock source 105 or to a preceding clock buffer 110, and the output node OUT connects either to a clock destination node or a clock buffer input terminal for a clock buffer in a subsequent tier.

In the embodiment of FIG. 2, the clock-adjust signal ClkAdj is distributed to each clock buffer 115 on a multi-line bus. There are, however, many other ways to distribute delay control signals within a given clock-distribution network. For example:

a. clock-adjust signal ClkAdj can be distributed serially to reduce the number of signal lines;

b. clock-adjust signal ClkAdj can be distributed as one or more analog signals (e.g., a version of delay-adjust signal DlyAdj can be distributed to a number of clock buffers similar to buffer 210 to reduce the number of registers 200 and DACs 202); and c. a version of delay-adjust signal DlyAdj can be shared by more than one clock buffer, such as by all members of a given clock tier or by all members of a tree.

Figure 3:
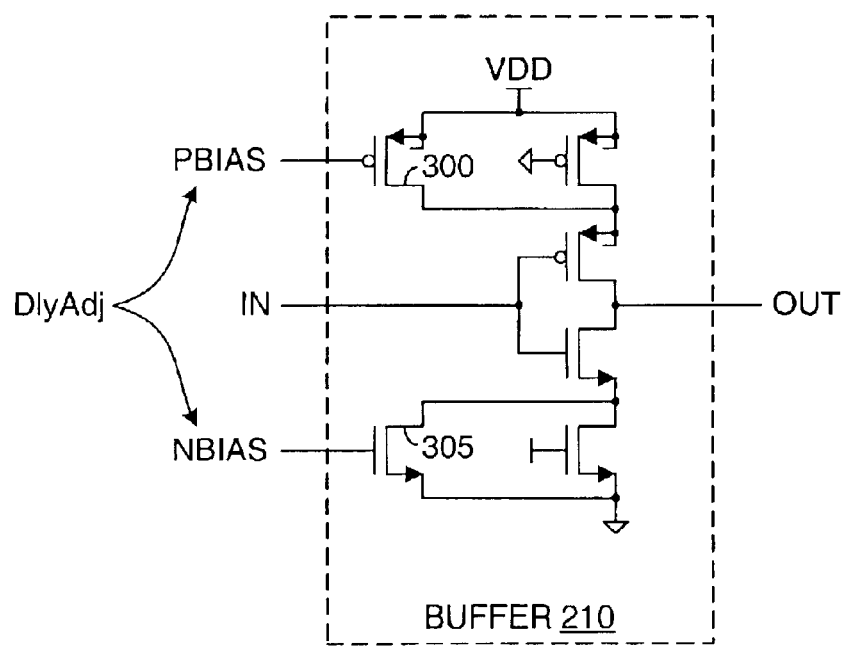
FIG. 3 details buffer 210 of FIG. 2.

FIG. 3 details an embodiment of buffer 210 of FIG. 2 in which the delay adjustment signal DlyAdj includes a pair of bias voltages PBIAS and NBIAS. Buffer 210 is a full-swing CMOS inverter that includes respective P- and N-type load transistors 300 and 305, the bias voltages on the gates of which control the signal propagation delay through buffer 210.

As configured, bias voltages PBIAS and NBIAS, which are representative of the count on clock adjust terminal ClkAdj, determine the signal propagation delay through buffer 210, and consequently through each clock buffer 115.

Figure 4:
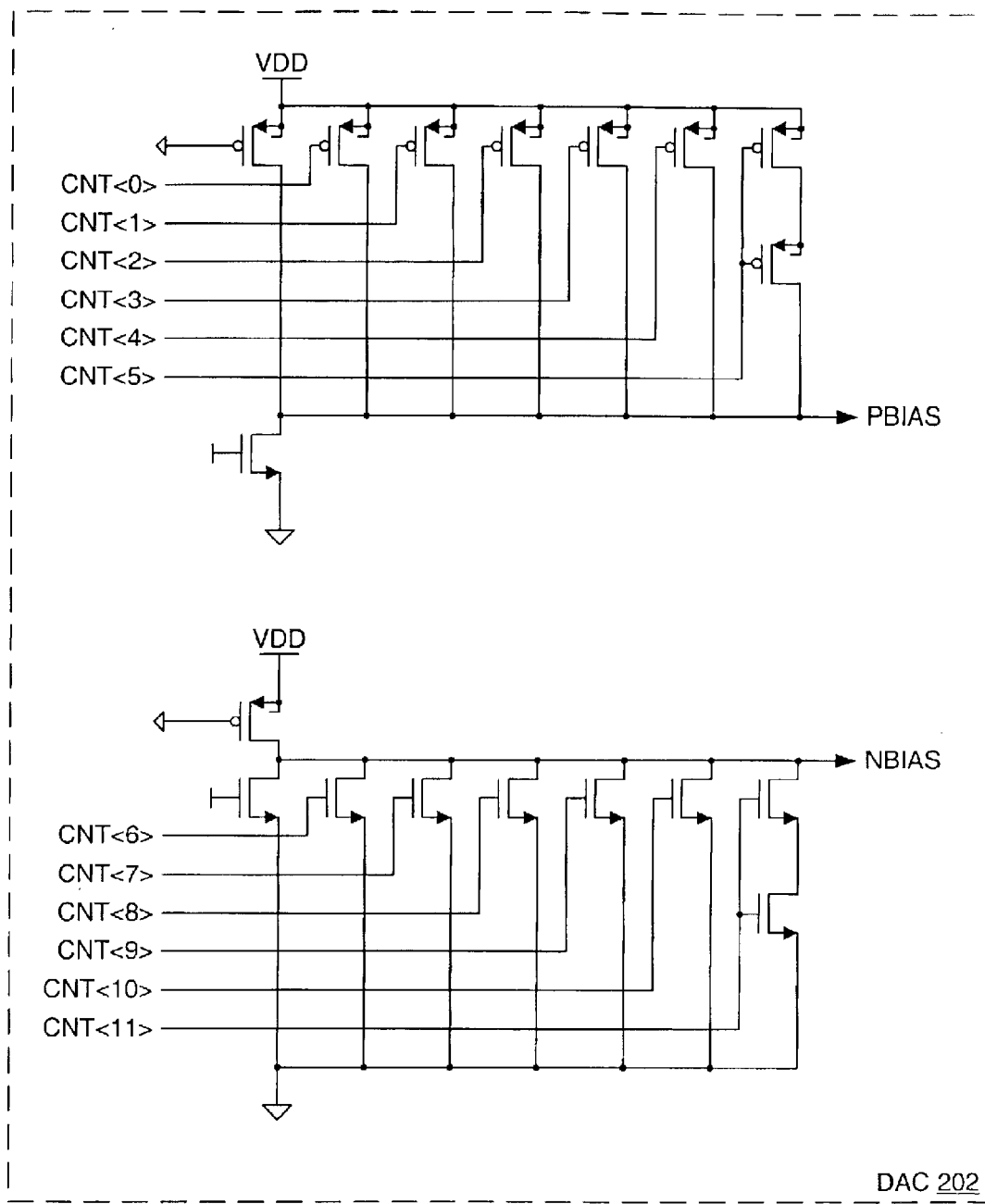
FIG. 4 is a detailed schematic of DAC 202 of FIG. 2.

FIG. 4 is a detailed schematic of an embodiment of DAC 202 of FIG. 2. DAC 202 receives twelve count lines CNT<11:0> from control circuit 125 via register 200. The first six count bits CNT<5:0> control seven conventional PMOS transistors to establish the voltage on terminal PBIAS. An additional six count lines CNT<6:11> control a similar number of NMOS transistors to establish the bias voltage NBIAS. The count provided on a twelve-bit bus from register 200 thus controls the signal-propagation delays through clock buffer 115.

Figure 5:
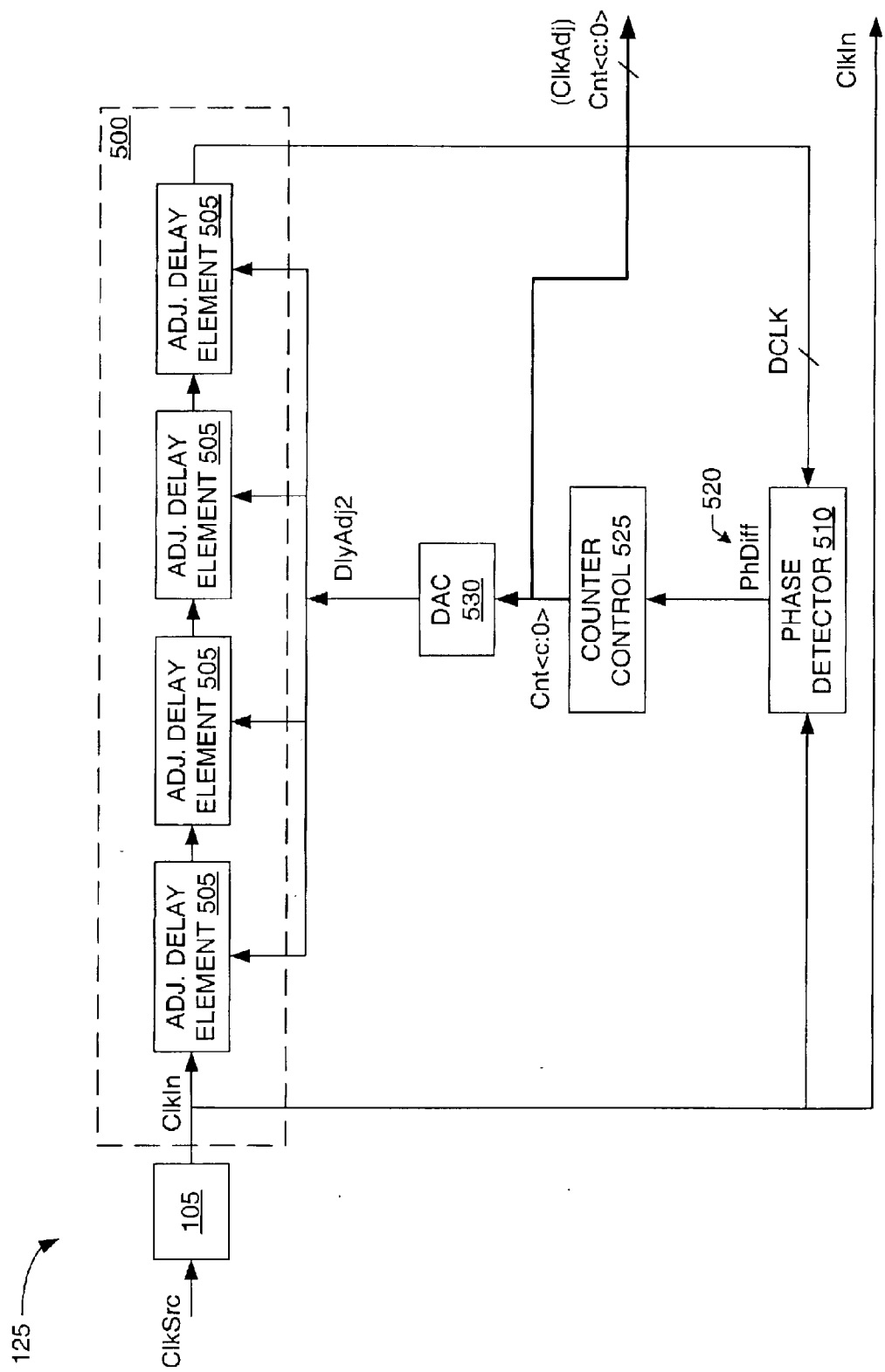
FIG. 5 depicts an embodiment of control circuit 125 in which a delay-locked loop establishes the count applied to each dynamically adjustable clock buffer 115 of clock tree 110.

FIG. 5 depicts an embodiment of control circuit 125 in which a delay-locked loop establishes the count applied to each dynamically adjustable clock buffer 115 of clock tree 110. Other clock-synchronization circuits (e.g., phase-locked loops) or other PVT-compensation circuits might also be used.

Some embodiments may save power by periodically sensing the PVT environment and making the appropriate adjustment, such as by updating the contents of register 200.

Control circuit 125 includes an adjustable delay section 500, which in turn includes four adjustable delay elements 505. The last adjustable delay element 505 in the series produces a delayed output clock signal DCLK to a phase detector 510. A second input to phase detector 510 receives the input clock ClkIn from clock source 105. In embodiments in which clock network 100 is on an integrated circuit, clock source 105 is typically a global clock buffer that receives a global clock signal from an external clock source.

Phase detector 510 compares the input clock ClkIn with the delayed clock DCLK to develop a phase difference signal PhDiff. The phase difference signal PhDiff feeds a counter control circuit 525, which employs phase difference signal PhDiff to develop a count signal Cnt<c:0>. There are twelve count lines (c=11), but other embodiments may include more or fewer.

Clock-adjust bus ClkAdj conveys the count signal Cnt<c:0> to each adjustable clock buffer 115, as shown in FIG. 1. The count signal Cnt<c:0> is also provided to a DAC 530. DAC 530 uses the count to develop a second delay-adjustment signal DlyAdj2 that controls the signal propagation delays through adjustable delay elements 505. In the present example each adjustable delay element 505 is adapted to provide 45 degrees of phase delay, so adjustable delay section 500 produces a total delay of 180 degrees with respect to the input clock ClkIn. For a more detailed discussion of a DLL similar to the one discussed with respect to FIG. 5, see U.S. Pat. No. 6,125,157 to Donnelly et al., which issued Sep. 26, 2000, and which is incorporated herein by reference.

Figure 6:
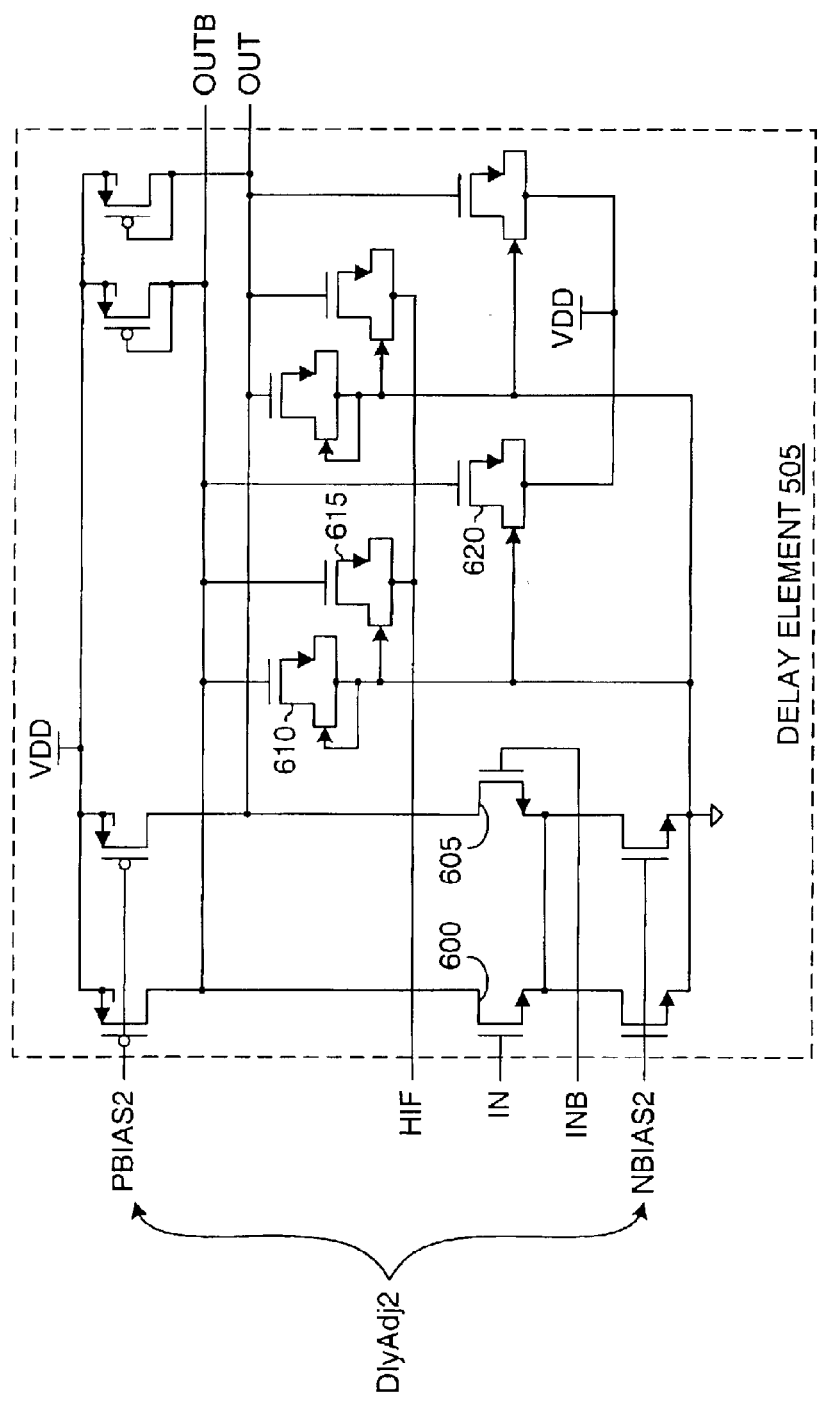
FIG. 6 depicts an embodiment of an adjustable delay element 505, one of four depicted in FIG. 5.

FIG. 6 depicts an embodiment of an adjustable delay element 505, one of four depicted in FIG. 5. Delay element 505 is a differential delay element having both true and complementary inputs IN and INB and outputs OUT and OUTB. Delay element 505 delays signals presented on complementary input inputs IN and INB to produce delayed output signals on terminals OUT and OUTB. The amount of delay depends, in part, upon the bias voltages PBIAS2 and NBIAS2 (DlyAdj2) developed by DAC 530, which control the amount of current switched by a differential pair 600 and 605.

Delay element 505 includes a number of capacitor-coupled transistors, including transistor 610, 615, and 620. The bulk of each capacitor-coupled transistor is connected to ground. The gates of transistors 610, 615, and 620 each connect to output terminal OUTB; the other terminals (source and drain) of transistors 610, 615, and 620 respectively connect to ground, an input terminal HIF, and supply voltage Vdd. Input terminal HIF can be set to different voltage levels to adjust the frequency response of delay element 505. Three additional capacitor-coupled transistors analogous to transistors 610, 615, and 620 perform the same functions on output terminal OUT.

Clock buffers 115 differ from adjustable delay elements 505 in the depicted embodiments. However, an attempt is made to match the behavior of clock buffers 115 with the behavior of delay elements 505 so the total signal propagation delay of each buffer 115, and consequently through clock tree 110, is proportional to the signal propagation delay through delay selection 500. Such matching can be accomplished by modeling and simulation, taking into account the strength of the buffers, the loads presented on the outputs of the buffers and delay elements, and other circuit parameters well understood by those of skill in the art.

Because the delay through adjustable delay section 500 is maintained constant (e.g., one half the period of the reference clock), the signal propagation delay from root node 106 to destination nodes ClkD1-n of the matched clock tree 110 also remains relatively constant. The signal propagation delay through clock tree 110 thus remains stable despite significant variations in process, supply-voltage, and temperature.

In an exemplary embodiment operating at a clock frequency of about 400 MHz, each buffer 115 exhibits a nominal delay of about 50 picoseconds and each delay section 500 exhibits a nominal delay of about 312 picoseconds. In other embodiments, the delay elements used to synchronize the clock synchronization circuit, and therefore to develop the clock adjustment signals, can be identical to the clock buffers. Such embodiments simplify the process of matching the delay element in the clock synchronization circuit and the clock buffers.

The embodiments of FIGS. 1–6 maintain a relatively stable signal propagation delay through clock tree 110. However, clock tree 110 should still be balanced to minimize clock skew. As noted in the "background" section above, clock skew is typically minimized by adding inverters and capacitors along relatively fast clock paths to increase the load—and reduce the speed—of those paths. Such changes are made under a certain set of conditions, a given ambient temperature, for example, and therefore cannot always be depended upon to be reliable under changed circumstances. There is therefore a need for better methods of minimizing clock skew.

Figure 7:
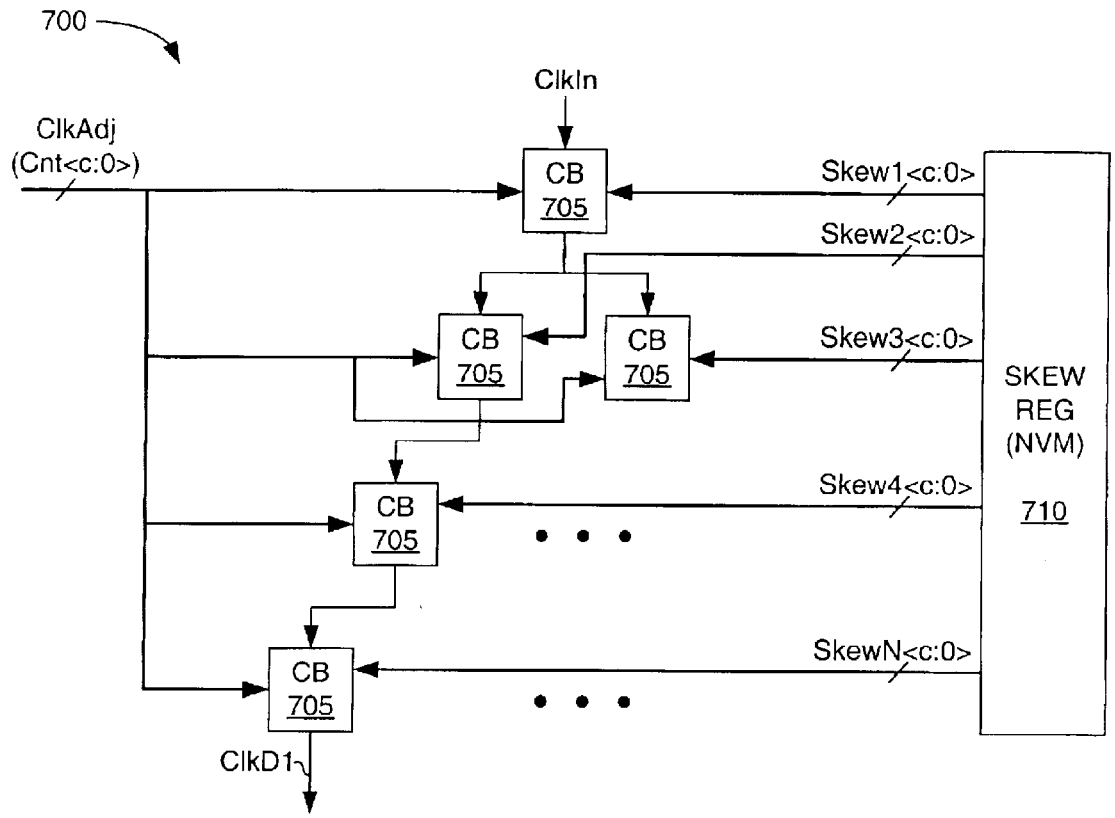
FIG. 7 depicts a clock distribution network 700 adapted in accordance with one embodiment of the invention that facilitates clock-skew minimization.

FIG. 7 depicts a clock distribution network 700 adapted in accordance with an embodiment of the invention that facilitates clock-skew minimization. Clock distribution network 700 receives a clock adjustment signal ClkAdj in the manner described above in connection with FIGS. 1 and 2. However, each clock buffer 705 of network 700 additionally receives a respective skew-offset signal Skew1<c:0> through SkewN<c:0> from a skew register 710 via a like-labeled skew-offset port. Skew register 710, non-volatile memory in one embodiment, provides skew off set data to each clock buffer 705. The contents of skew register 710 can be adjusted to add or subtract from the nominal delay through each clock buffer 705. The clock skew of network 700 can therefore be adjusted by simply altering the contents of skew register 710.

Figure 8:
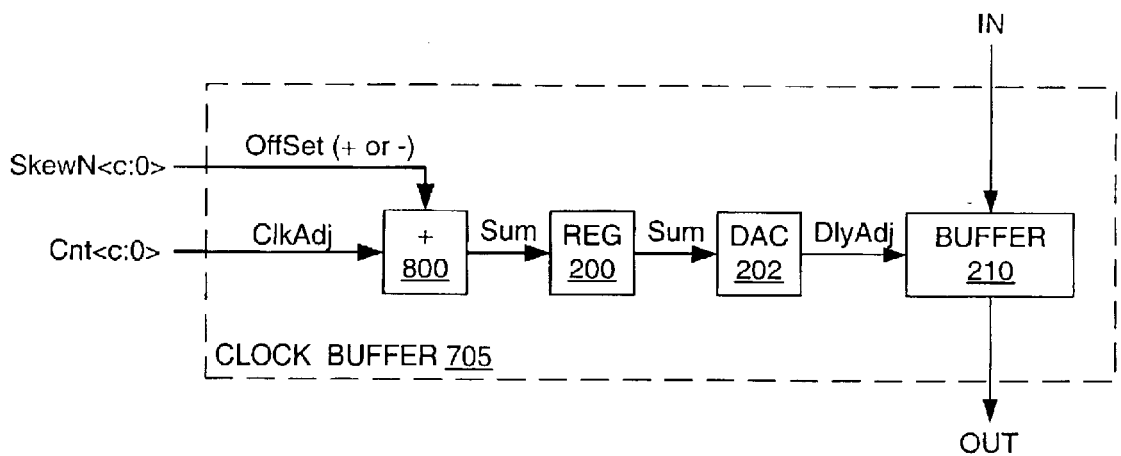
FIG. 8 depicts an embodiment of clock buffer 705 of FIG. 7.

FIG. 8 depicts an embodiment of clock buffer 705 of FIG. 7 that simplifies the process of balancing signal paths in clock distribution networks. Clock buffer 705 is similar to clock buffer 115 of FIGS. 2–4, like-numbered elements being the same. Clock buffer 705 additionally includes a digital adder 800 that combines a skew offset value from register 710 (FIG. 7) with the delay adjustment provided on lines Cnt<c:0>. The skew offset can be positive or negative, so adder 800 can increase or reduce the compensated clock adjustment value on lines Cnt<c:0> to provide an offset compensation value to DAC 202. In some cases, as where two data paths to a given synchronous component impose different delays upon their respective data, the skew offset can be adjusted dynamically to account for timing differences between the data paths. In the present example, each branch of clock distribution network 700 is easily adjusted independent of other branches. Once skew adjustments are made, voltage and temperature fluctuations are compensated for using the clock adjust signal to each clock buffer 705. However, the aspects of distribution network 700 that simplify clock-skew minimization can be used to advantage without PVT compensation.

Figure 9:
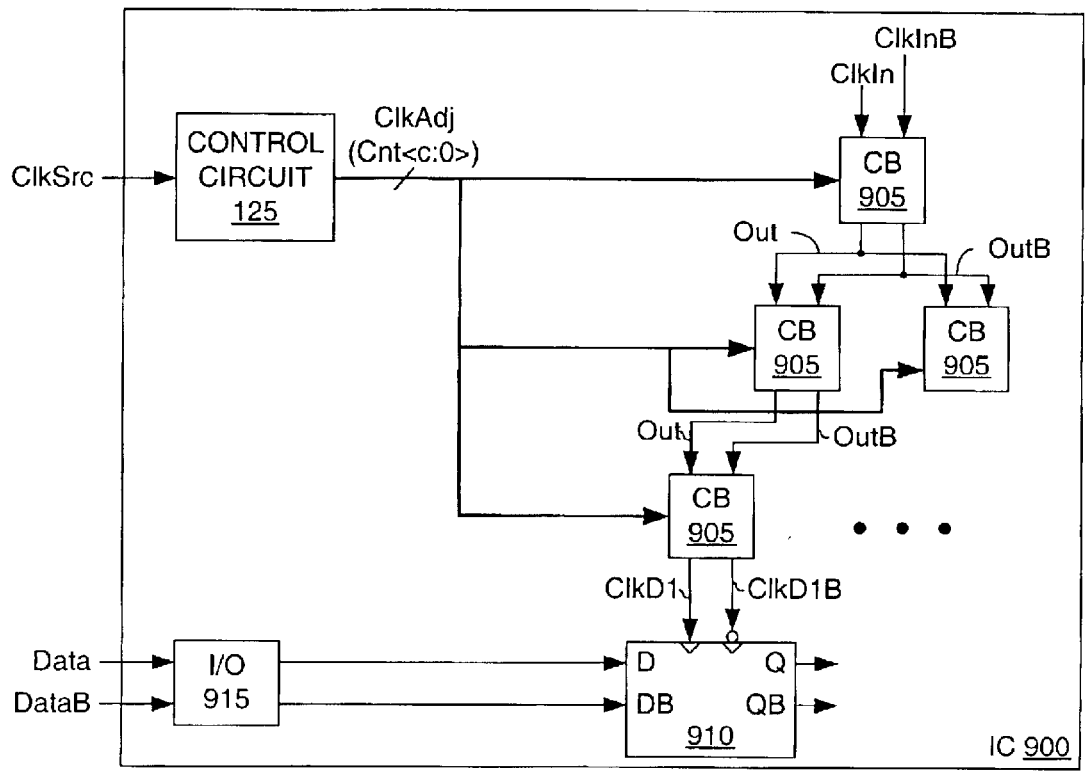
FIG. 9 depicts an integrated circuit 900 having an internal clock-distribution network adapted in accordance with yet another embodiment of the invention.

FIG. 9 depicts an integrated circuit (IC) 900 having an internal clock-distribution network adapted in accordance with yet another embodiment of the invention. The clock distribution network includes control circuit 125, described above, and a clock tree that includes a plurality of small-swing, differential clock buffers 905. The clock tree terminates at complementary destination nodes ClkD1 and ClkD1B, which connect to an exemplary flip-flop 910 adapted to receive small-swing, differential clock signals.

The term "small-swing," as used herein, means the voltage variations produced on the output terminals of buffers 905 are less than the voltage difference separating the supply voltages (e.g., Vdd and ground) used to power buffers 905. In an embodiment in which Vdd is 1.2 volts, for example, the complementary clock signals each have amplitude of about 800 millivolts. Small-swing clock distribution networks are commonly used to provide high-speed, low-power communication between integrated circuits. One example of a small-swing standard used for point-to-point and multi-drop cable driving applications is low-voltage differential signaling (LVDS). Other such standards include ECL (emitter-coupled logic), PECL (positive ECL), and CML (current-mode logic). Each of the above-mentioned standards involves differential signaling, but small-signal signal distribution can also be single ended. Though not shown here, for brevity, the clock distribution network of IC 900 can be adapted to facilitate skew adjustment as discussed above in connection with FIGS. 7 and 8.

Figure 10:
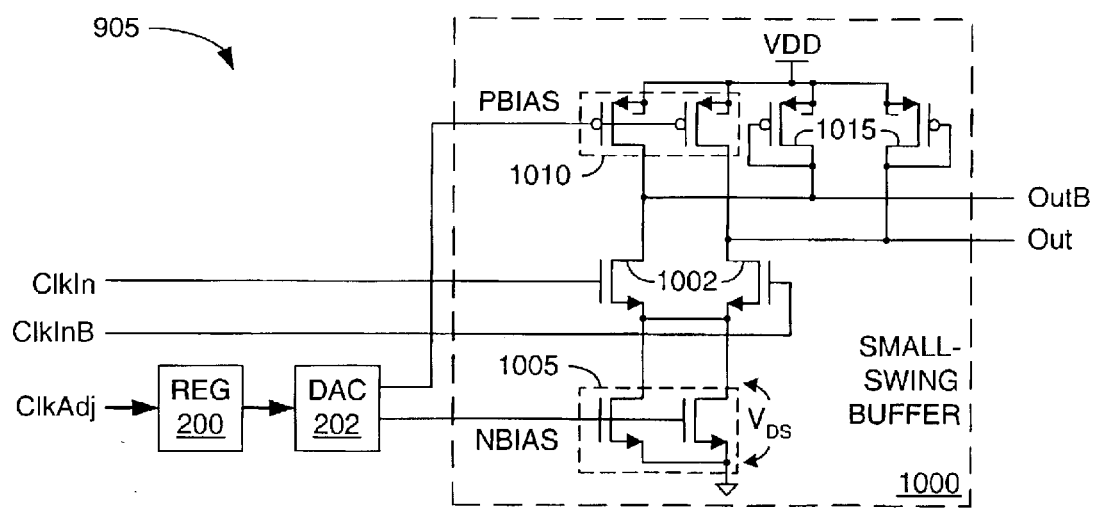
FIG. 10 details a portion of one of differential clock buffers 905 of FIG. 9.

FIG. 10 details a portion of one of differential clock buffers 905 of FIG. 9. Clock buffer 905 includes the same register 200 and DAC 202 described above. In place of CMOS buffer 210, however, clock buffer 905 includes a small-swing, differential buffer 1000. The bias voltages NBIAS and PBIAS from DAC 202, derived from the clock-adjust signal from control circuit 125, control the signal-propagation delays through clock buffers 905 in much the same manner described above with respect to clock buffer 115. Buffers 1000 differ from buffer 115, however, in that buffer 1000 employs current-mode signaling to reduce noise sensitivity and improve speed performance.

Buffer 1000 includes a source-coupled pair of NMOS input transistors 1002. The source-coupled pair is connected to ground via a current source 1005 and to Vdd via a current source 1010 and a pair of PMOS load transistors 1015. The ranges of bias voltages for terminals NBIAS and PBIAS are selected so the transistors within current source 1005 remain in saturation. In other words, the drain-to-source voltage VDS of current source 1005 does not fall below the saturation voltage VDS(SAT) of its constituent transistors. (In CMOS transistors, the gate is the control terminal and the source and drain are current-handling terminals.)

Maintaining current source 1005 in saturation prevents output signals Out and OutB from reaching ground potential. The voltage swings on output terminals Out and OutB are therefore limited to an output voltage range VOR less than the voltage difference separating the supply voltages (Vdd–0) by at least about the saturation voltage $V_{DS(SAT)}$ of current source 1005. In practice, the voltage swings on output terminals Out and OutB may dip slightly below $V_{DS(SAT)}$. In any case, the output voltage range will remain substantially less than the full "rail-to-rail" power supply range. In an embodiment that complies with "Rambus Signaling Level," or RSL, technologies, Vdd is about 1.2 volts and output voltage range $V_{OR}$ is about 800 millivolts.

Figure 11:
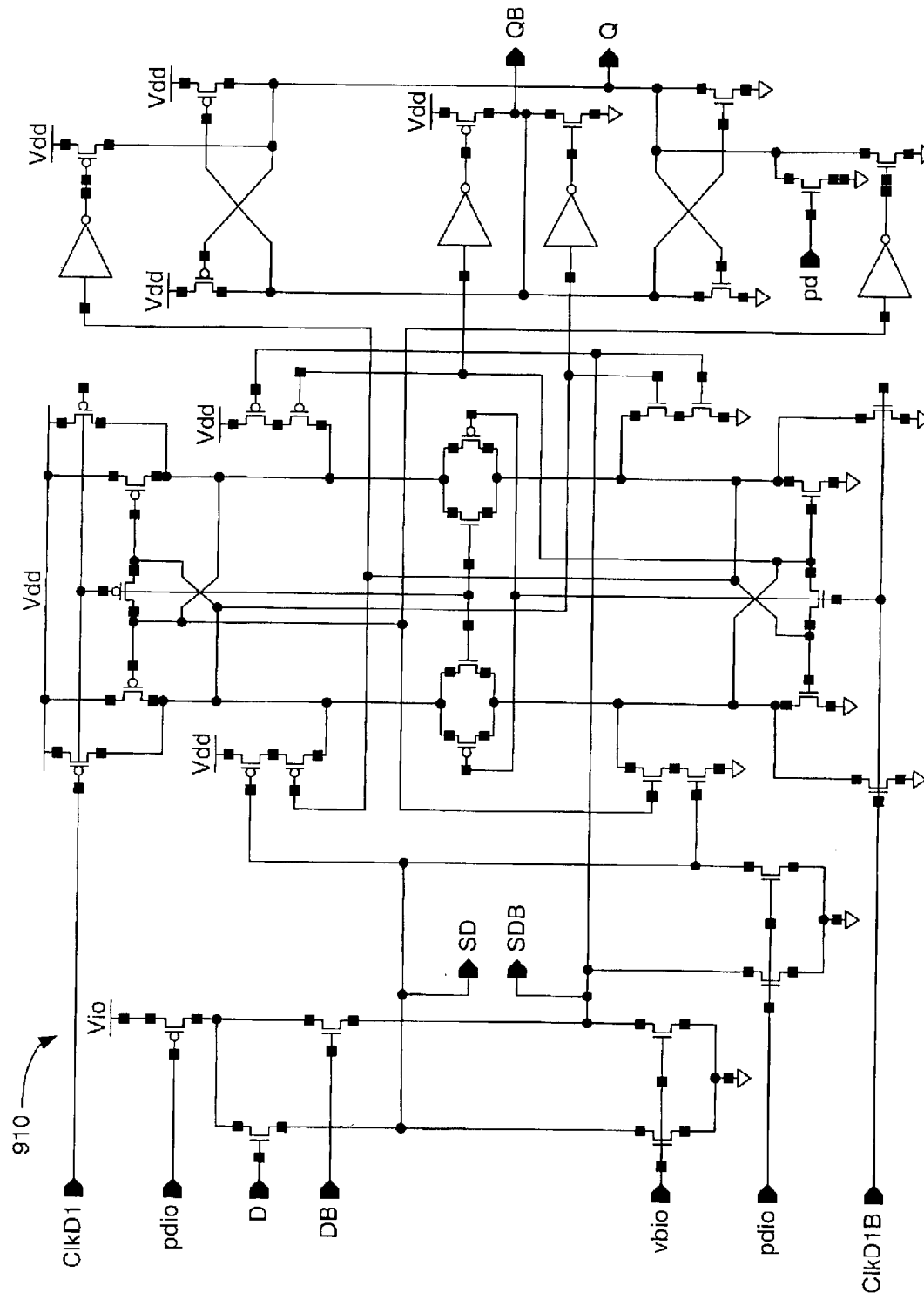
FIG. 11 schematically depicts an embodiment of flip-flop 910 of FIG. 9.

FIG. 11 schematically depicts an embodiment of flip-flop 910 of FIG. 9. Flip-flop 910 includes complementary data terminals D and DB that are assumed, in this example, to be connected to some input circuitry that operates at a supply voltage Vio greater than Vdd. Consequently, flip-flop 910 includes a level-shifter that shifts the voltage levels used to express the incoming data. The resulting shifted complementary data signals SD and SDB are differential inputs to a regenerative (push-pull) latch powered by supply terminals Vdd and ground. A buffer stage, also powered by supply terminals Vdd and ground, completes flip-flop 910, providing complementary output signals Q and QB on like-named output terminals. Flip-flop 910 includes a number of bias terminals pdio, vbio, and pd, the purposes of which will be apparent to those of skill in the art.

Conventional clock trees' are designed to operate at the fastest expected clock speed. Conventional designs thus include clock buffers capable of providing a maximum slew rate dictated by the fastest expected clock speed. Unfortunately, such fast-switching buffers are not optimized for lower clock speeds, and consequently consume more power than is necessary for low-speed operation. In contrast, the strength of the above-described clock buffers—and thus the power they dissipate—depends upon the speed of the clock. Clock distribution networks in accordance with some embodiments of the invention thus automatically compensate for reduced clock speeds with reduced power consumption. Applications that do not require frequency-compensated clocks can use control circuits that, unlike control circuit 125 detailed in FIG. 5, do not use clock frequency as a reference.

While the present invention has been described in connection with specific embodiments, variations of these embodiments will be obvious to those of ordinary skill in the art. For example: PVT detectors can be distributed geographically throughout a clock distribution network, each PVT detector servicing one or more clock buffers, to better compensate for local PVT variations; and while the foregoing examples show a tree-structure, the term "clock tree" is intended to apply equally to any number of other clock structures, such as clock grids. Moreover, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A clock distribution network comprising:
   a. a clock source terminal adapted to receive a clock signal having a clock frequency and a clock period;
   b. a clock tree having:
      i. a root node connected to the clock source terminal;
      ii. a plurality of clock destination nodes; and
      iii. at least one dynamically adjustable clock buffer disposed between the root node and at least one of the plurality of destination nodes, the clock buffer including at least one buffer-control terminal; and
   c. a control circuit having:
      i. a control-circuit clock terminal coupled to the clock source terminal and adapted to receive the clock signal; and
      ii. a clock-adjustment port coupled to the buffer-control terminal and adapted to issue a buffer-control signal;
   d. wherein the dynamically adjustable clock buffer exhibits a delay responsive to the buffer-control signal; and
   e. wherein the control circuit varies the buffer-control signal to maintain the delay of the adjustable clock buffer in proportion to the clock period.

2. The clock distribution network of claim 1 formed using a process and supplied with a supply voltage, wherein the buffer-control signal varies with at least one of: temperature, the supply voltage, and the process to maintain the delay of the adjustable clock buffer.

3. The clock distribution network of claim 1, wherein the buffer control signal is a digital signal.

4. A clock distribution network comprising:
   a. a clock source terminal adapted to receive a global clock signal; and
   b. a clock tree having:
      i. a root node connected to the clock source terminal;
      ii. a plurality of clock destination nodes; and
      iii. at least one dynamically adjustable clock buffer disposed between the root node and at least one of the plurality of destination nodes, the clock buffer including at least one buffer-control terminal;
   c. wherein the buffer control signal is a digital signal; and
   d. wherein the clock buffer comprises a digital-to-analog converter having an input port adapted to receive the digital signal.

5. The clock distribution network of claim 4, wherein the digital-to-analog converter is adapted to convert the digital signal into at least one bias voltage representative of the digital signal.

6. A clock distribution network comprising:
   a. a clock source terminal adapted to receive a global clock signal; and
   b. a clock tree having:
      i. a root node connected to the clock source terminal;
      ii. a plurality of clock destination nodes; and
      iii. at least one dynamically adjustable clock buffer disposed between the root node and at least one of the plurality of destination nodes, the clock buffer including at least one buffer-control terminal;
   c. wherein the clock tree includes a plurality of the dynamically adjustable clock buffers arranged in tiers of clock buffers, and wherein the clock buffers in a first of the tiers connect to the clock buffers in a second of the tiers via a plurality of clock branches.

7. The clock distribution network of claim 1, further comprising a clock synchronization circuit having a synchronization-circuit output terminal connected to the buffer-control terminal.

8. A clock distribution network comprising:
   a. a clock source terminal adapted to receive a global clock signal;
   b. a clock tree having:
      i. a root node connected to the clock source terminal;
      ii. a plurality of clock destination nodes; and
      iii. at least one dynamically adjustable clock buffer disposed between the root node and at least one of the plurality of destination nodes, the clock buffer including at least one buffer-control terminal; and
   c. a clock synchronization circuit having a synchronization-circuit output terminal connected to the buffer-control terminal;
   d. wherein the clock synchronization circuit comprises a delay-locked loop.

9. A clock tree comprising:
   a. a root node connected to a clock source;
   b. a first clock tier having a first dynamically adjustable clock buffer, the first dynamically adjustable clock buffer including a first input terminal connected to the root node, a first output terminal, and a first clock-adjust terminal;
   c. a second clock tier having a second dynamically adjustable clock buffer, the second dynamically adjustable clock buffer including a second input terminal connected to the first output terminal, a second output terminal, and a second clock-adjust terminal.

10. The clock tree of claim 9, further comprising a control circuit adapted to generate a delay-control signal on a delay-control-signal output terminal, wherein the delaycontrol-signal output terminal connects to the first clock-adjust terminal.

11. The clock tree of claim 10, wherein the delay-control-signal output terminal connects to the second clock-adjust terminal.

12. The clock tree of claim 9, further comprising a clock-synchronization circuit having a synchronization-circuit output terminal connected to the first clock-adjust terminal.

13. The clock tree of claim 12, wherein the synchronization-circuit output terminal is connected to the second clock-adjust terminal.

14. A clock tree comprising:
   a. a root node connected to a clock source;
   b. a first clock tier having a first dynamically adjustable clock buffer, the first dynamically adjustable clock buffer including a first input terminal connected to the root node, a first output terminal, and a first control terminal;
   c. a second clock tier having a second dynamically adjustable clock buffer, the second dynamically adjustable clock buffer including a second input terminal connected to the first output terminal, a second output terminal, and a second control terminal; and
   d. a clock-synchronization circuit having a synchronization-circuit output terminal connected to the first control terminal;
   e. wherein the clock-synchronization circuit includes first and second adjustable delay elements.

15. The clock tree of claim 14, wherein the first and second dynamically adjustable clock buffers exhibit respective first and second signal propagation delays, wherein the first and second adjustable delay elements exhibit third and fourth signal propagation delays, and wherein the first and third signal propagation delays are substantially equal and the second and fourth signal propagation delays are substantially equal.

16. The clock tree of claim 14, wherein the first and second dynamically adjustable delay elements include delay-element control terminals connected to the synchronization-circuit output terminal.

17. A clock tree comprising:
   a. a root node connected to a clock source;
   b. a first clock tier having a first dynamically adjustable clock buffer, the first dynamically adjustable clock buffer including a first input terminal connected to the root node, a first output terminal, and a first control terminal;
   c. a second clock tier having a second dynamically adjustable clock buffer, the second dynamically adjustable clock buffer including a second input terminal connected to the first output terminal, a second output terminal, and a second control terminal; and
   d. a clock-synchronization circuit having a synchronization-circuit output terminal connected to the first control terminal;
   e. wherein the synchronization circuit comprises a delay-locked loop.

18. A method of establishing and maintaining a nominal signal-propagation delay from a root node of a clock tree to a plurality of destination nodes of the clock tree, the method comprising:
   a. including at least one adjustable clock buffer in the clock tree;
   b. developing a control signal that depends, at least in part, on an operating temperature of the clock tree; and
   c. employing the control signal to adjust the clock buffer in response to changes in the operating temperature.

19. The method of claim 18, wherein the control signal additionally depends upon an operating voltage of the clock tree.

20. The method of claim 18, wherein the control signal additionally depends upon process variations that affect the clock tree.

21. A clock tree comprising:
   a. a root node connected to a clock source;
   b. a clock tier having at least one dynamically adjustable clock buffer, the dynamically adjustable clock buffer including an input node and an output node, wherein the dynamically adjustable clock buffer imposes a signal-propagation delay upon signal edges traversing the adjustable clock buffer from the input node to the output node; and
   c. means for adjusting the signal-propagation delay in response to changes in at least one of temperature and supply voltage.

22. A clock distribution network comprising:
   a. a root node connected to a clock source;
   b. a first clock tier having a first adjustable clock buffer, the first adjustable clock buffer including a first input terminal connected to the root node, a first output terminal, and a first skew-offset port; and
   c. a second clock tier having a second adjustable clock buffer, the second adjustable clock buffer including a second input terminal connected to the first output terminal, a second output terminal, and a second skew-offset port.

23. The clock distribution network of claim 22, wherein the first adjustable clock buffer further includes a clock-adjust terminal.

24. The clock distribution network of claim 23, further comprising a control circuit having a clock-adjust output port connected to the clock-adjust terminal, wherein the control circuit is adapted to provide a clock-adjust signal on the clock-adjust output port, and wherein the clock-adjust signal varies with at least one of power-supply voltage and temperature.

25. The clock distribution network of claim 24, wherein the control circuit comprises a clock-synchronization circuit.

26. The clock distribution network of claim 22, further comprising a memory connected to the first and second skew-offset ports.

27. The clock distribution network of claim 26, wherein the memory is non-volatile memory.

28. The clock distribution network of claim 26, wherein the first adjustable clock buffer exhibits a skew, and wherein the memory is adapted to store data affecting the skew.

29. The clock distribution network of claim 28, wherein the second adjustable clock buffer exhibits a second skew, and wherein the data affects the second skew.

30. The clock distribution network of claim 22, wherein the first and second skew-offset ports each include more than one skew-offset terminal.

31. A clock-distribution network comprising:
   a. a clock synchronization circuit having a synchronization-circuit input terminal adapted to receive a reference clock having a period and a synchronization-circuit output terminal adapted to provide a clock-adjust signal; and
   b. at least one dynamically adjustable clock buffer adapted to impose a delay in the reference clock, the clock buffer including at least one buffer-control terminal connected to the synchronization-circuit output terminal, adapted to receive the clock-adjust signal;
   c. wherein the clock synchronization circuit is adapted to alter the clock-adjust signal to maintain the delay in proportion to the reference-clock period.

32. A clock-distribution network comprising:
   a. a clock synchronization circuit having a synchronization-circuit input terminal adapted to receive a reference clock and a synchronization-circuit output terminal adapted to provide a clock-adjust signal; and
   b. at least one dynamically adjustable clock buffer, including at least one buffer-control terminal connected to the synchronization-circuit output terminal, adapted to receive the clock-adjust signal;
   c. wherein clock synchronization circuit includes a delay-locked loop.

33. The clock-distribution network of claim 31, wherein the clock-adjust signal is a digital signal.

34. The clock-distribution network of claim 31, wherein the clock buffer inverts the reference clock.

35. A clock-distribution network comprising:
   a. a clock synchronization circuit having a synchronization-circuit input terminal adapted to receive a reference clock and a synchronization-circuit output terminal adapted to provide a clock-adjust signal; and
   b. at least one dynamically adjustable clock buffer, including at least one buffer-control terminal connected to the synchronization-circuit output terminal, adapted to receive the clock-adjust signal;
   c. wherein the dynamically adjustable clock buffer includes complementary clock-buffer input terminals and complementary clock-buffer output terminals.

36. A method of providing a stable, distributed clock signal over a clock network to multiple destination nodes on an integrated circuit, the method comprising:
   a. monitoring at least one of temperature and supply-voltage on the integrated circuit; and
   b. adjusting at least one signal-propagation delay through the clock network in response to changes in the at least one of the temperature and supply voltage.

37. The method of claim 36, wherein the clock network includes a plurality of clock buffers, and wherein adjusting the at least one signal-propagation delay through the clock network includes adjusting the slew rate of at least one of the clock buffers.

38. A method of providing a stable, distributed clock signal over a clock network to multiple destination nodes on an integrated circuit, the method comprising:
   a. monitoring a frequency of the clock signal; and
   b. adjusting at least one signal-propagation delay through the clock network in response to changes in the frequency to maintain the signal-propagation delay through the clock network in inverse proportion to the frequency.

39. A method of providing a stable, distributed clock signal over a clock network to multiple destination nodes on an integrated circuit, the method comprising:
   a. monitoring a frequency of the clock signal; and
   b. adjusting at least one signal-propagation delay through the clock network in response to changes in the frequency to maintain the signal-propagation delay through the clock network in inverse proportion to the frequency;
   c. wherein the clock network includes a plurality of clock buffers, and wherein adjusting the at least one signal-propagation delay through the clock network includes adjusting the slew rate of at least one of the clock buffers.

40. A clock distribution network comprising:
   a. a clock source; and
   b. a clock tree having:
      i. a root node connected to the clock source;
      ii. a plurality of clock destination nodes;
      iii. a first dynamically adjustable clock tier disposed between the root node and at least one of the plurality of destination nodes, the first clock tier including at least one first clock-adjust terminal; and
      iv. a second dynamically adjustable clock tier disposed between the first dynamically adjustable clock tier and the at least one of the plurality of destination nodes, the second clock tier including at least one second clock-adjust terminal.

41. The clock distribution network of claim 40 formed using a process and supplied with a supply voltage, the clock distribution network further comprising a control circuit connected to the first and second clock-adjust terminals and adapted to provide a clock-adjust signal that varies with at least one of: temperature, the supply voltage, and the process to maintain a relatively constant signal propagation delay through the clock tree.

42. The clock distribution network of claim 41, wherein the clock-adjust signal is a digital signal.

43. A clock distribution network formed using a process and supplied with a supply voltage, the clock distribution network comprising:
   a. a clock source;
   b. a clock tree having:
      i. a root node connected to the clock source;
      ii. a plurality of clock destination nodes;
      iii. at least one dynamically adjustable clock buffer disposed between the root node and at least one of the plurality of destination nodes, the clock buffer including at least one clock-adjust terminal; and
   c. a control circuit connected to the clock-adjust terminal and adapted to provide a clock-adjust signal that varies with at least one of: temperature, the supply voltage, and the process;
   d. wherein the clock buffer comprises a digital-to-analog converter having an input port adapted to receive the digital signal.

44. The clock distribution network of claim 43, wherein the digital-to-analog converter is adapted to convert the digital signal into at least one bias voltage representative of the digital signal.

45. A clock distribution network comprising:
   a. a clock source; and
   b. a clock tree having:
      i. a root node connected to the clock source;
      ii. a plurality of clock destination nodes; and
      iii. at least one dynamically adjustable clock buffer disposed between the root node and at least one of the plurality of destination nodes, the clock buffer including at least one clock-adjust terminal;
   c. wherein the clock tree includes a plurality of the dynamically adjustable clock buffers arranged in tiers of clock buffers, and wherein the clock buffers in a first of the tiers connect to the clock buffers in a second of the tiers via a plurality of clock branches.

46. The clock distribution network of claim 40, further comprising a clock control circuit having a control-circuit output terminal connected to the clock-adjust terminal.

47. The clock distribution network of claim 46, wherein the clock control circuit comprises a delay-locked loop.

* * * * *